(12) United States Patent
Dow

(10) Patent No.: US 7,439,806 B2
(45) Date of Patent: Oct. 21, 2008

(54) BIAS CONTROL CIRCUIT AND METHOD OF CONTROLLING BIAS OF RF POWER AMPLIFIER

(75) Inventor: Gee Samuel Dow, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 51 days.

(21) Appl. No.: 11/710,942

(22) Filed: Feb. 27, 2007

(65) Prior Publication Data

US 2008/0204145 A1    Aug. 28, 2008

(51) Int. Cl.
*H03G 3/10* (2006.01)

(52) U.S. Cl. .................. 330/285; 330/296; 330/133; 330/288

(58) Field of Classification Search ................ 330/285, 330/296, 133, 288

See application file for complete search history.

(56) References Cited

U.S. PATENT DOCUMENTS

| | | | |
|---|---|---|---|
| 6,339,361 B1 * | 1/2002 | Khesbak et al. | 330/285 |
| 6,831,517 B1 * | 12/2004 | Hedberg et al. | 330/285 |
| 6,937,102 B2 * | 8/2005 | Lopez et al. | 330/296 |
| 7,157,974 B2 * | 1/2007 | Grillo et al. | 330/285 |
| 2007/0286609 A1 * | 12/2007 | Ikram et al. | 398/197 |

* cited by examiner

*Primary Examiner*—Patricia Nguyen

(57) ABSTRACT

A bias control circuit for an RF amplifier having an output device for providing an output signal to a load and a driver device for driving the output device includes a current mirror circuit for providing a driver device bias current to the driver device and an output device bias current to the output device. When the amplifier operates in a high power mode, the current mirror circuit supplies the driver device bias current at a level to turn on the driver device at a high current level and an output device bias current to turn on the output device. When the amplifier operates in a low power mode, the current mirror circuit supplies a driver device bias current to turn on the driver device at a reduced current level and an output device bias current to turn off the output device.

20 Claims, 8 Drawing Sheets

BIAS CONTROL CIRCUIT AND METHOD OF CONTROLLING BIAS OF RF POWER AMPLIFIER

BACKGROUND

Radio Frequency (RF) amplifiers are used in a variety of devices, including mobile communications devices such as mobile telephones. In particular, an RF power amplifier is employed to amplify and transmit an RF signal from a mobile communication device.

The required time between battery charges is one important performance specification for a mobile communication device. Meanwhile, an RF power amplifier that transmits the output signal from a mobile communication device often represents the largest power drain on the mobile device's power supply (e.g., a battery). As a result, the required time between charges can be lengthened if the efficiency of the RF power amplifier could be improved.

Therefore, to reduce power consumption, some mobile communication devices exercise some form of control over the output power of the RF power amplifier. In particular, when the mobile communication device is operating somewhat far away from a base station, the device may operate in a "high power" mode wherein the RF output power level is set at or near its maximum value. On the other hand, when the mobile communication device is operating somewhat close to a base station, the device may operate in a "low power" mode wherein the RF output power level is set at a reduced level. Variations of this "dual-mode" operation are possible, for example, where the current battery voltage level and the remaining battery capacity are also taken into consideration when switching between operating modes.

When the RF power amplifier is switched into the "low power" mode, it consumes less current from the battery than when it operates in the "high power" mode. Therefore, when the RF power amplifier is switched to the "low power" mode, the mobile communication device is able to conserve battery power and thereby extend the required time between charges.

However, in a typical arrangement, in the low power mode the operating efficiency of the RF power amplifier is reduced to a significant degree. For the same output power level, when the efficiency of the RF power amplifier is decreased, this means that more wasted current is drawn from the battery. So although the low power mode conserves battery power and thereby extends the required time between charges, it could provide an even greater benefit if the operating efficiency in the low power mode could be improved.

What is needed, therefore, is an improved bias control circuit for an RF amplifier so that it can operate in both a high output power mode and a low output mode with high efficiency. What is further needed is a method of providing bias control to an RF amplifier so that it can operate in both a high output power mode and a low output mode with high efficiency.

SUMMARY

In an example embodiment, a bias control circuit is provided for a radio frequency (RF) amplifier having an output device for providing an output signal to a load and a driver device for providing a drive signal to the output device. The bias control circuit comprises: a voltage reference circuit; a current mirror circuit; an adaptive mode control circuit; and a driver stage control circuit. The voltage reference circuit is adapted to receive a supply voltage and to produce therefrom a reference voltage. The current mirror circuit is adapted to receive the reference voltage and to provide a driver device bias current for the driver device and an output device bias current for the output device. The adaptive mode control circuit is adapted to receive a supply voltage and in response to a voltage level of the supply voltage, to provide to the current mirror circuit a first mode control signal indicating one of a high power mode and a low power mode, the first mode control signal adjusting the output device bias current provided by the current mirror circuit to the output device for selectively turning on the output device in the high power mode and turning off the output device in the low power mode. The driver stage control circuit adapted to receive a second mode control signal indicating one of the high power mode and the low power mode, and in response to the second mode control signal indicating the low power mode, to receive a bias adjust voltage and in response thereto to provide a driver device bias current adjust signal to the current mirror circuit for adjusting the driver device bias current.

In another example embodiment, a bias control circuit is provided for a radio frequency (RF) amplifier having an output device for providing an output signal to a load and a driver device for providing a drive signal to the output device. The bias control circuit includes a current mirror circuit for providing a driver device bias current for the driver device and an output device bias current for the output device. When the amplifier operates in a high power mode the current mirror circuit supplies the driver device bias current at a level for turning on the driver device at a high current level and an output device bias current for turning on the output device. When the amplifier operates in a low power mode the current mirror circuit supplies a driver device bias current for turning on the driver device at a variable current level and an output device bias current for turning off the output device.

In yet another example embodiment, a method is provided for supplying bias currents to a radio frequency (RF) amplifier having an output device for providing an output signal to a load and a driver device for providing a drive signal to the output device. The method includes: when the amplifier operates in a high power mode, supplying a driver device bias current at a level adapted to turn on the driver device at a high current level, and supplying an output device bias current for turning on the output device; and when the amplifier operates in a low power mode, supplying a driver device bias current for turning on the driver device at a variable current level, and supplying an output device bias current for turning off the output device.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

As used herein, the term "radio frequency" or "RF" pertains to VHF, UHF, microwave and even millimeter wave frequencies to the extent that technology permits the devices and circuits disclosed herein to be fabricated and operated at such frequencies. Also, unless otherwise noted, when a first device is said to be connected to a second device, this encompasses cases where one or more intermediate devices may be employed to connect the two devices to each other.

Figure 1:
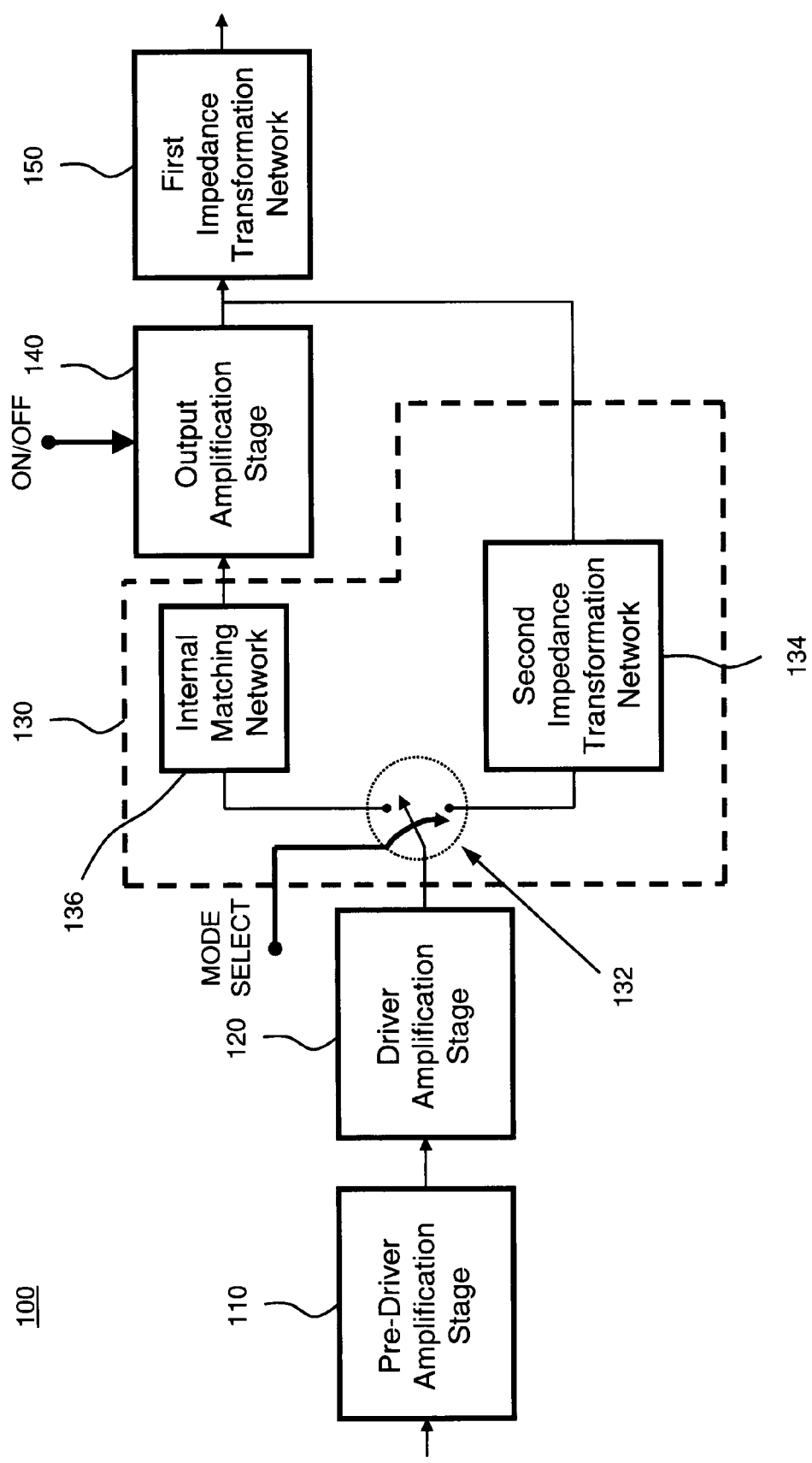
FIG. 1 shows a functional block diagram of one embodiment of a radio frequency (RF) amplifier.

FIG. 1 shows a functional block diagram of one embodiment of an RF amplifier 100. RF amplifier 100 includes: a pre-driver amplification stage 110, a driver amplification stage 120, a switching circuit 130, an output amplification stage 140, and a first impedance transformation network 150. Switching circuit 130 includes a switch 132, a second impedance transformation network 134, and an internal matching network 136. Switch 132 has first and second terminals and a control terminal responsive to a MODE SELECT signal. Also, output amplification stage 140 includes an ON/OFF control. The output of first impedance transformation network 150 is connected to a load (not shown in FIG. 1), which is not itself part of RF amplifier 100, and may comprise one or more antennas.

In general, RF amplifier 100 is configured to operate selectively in either a high power (HP) mode or a low power (LP) mode, in response to the MODE SELECT signal and the ON/OFF signal. In the embodiment of FIG. 1, in the HP mode, the MODE SELECT signal has a first state or value (e.g., "LOW") to cause switch 132 to select internal matching network 136, and the ON/OFF signal is ON to turn on output amplification stage 140. Accordingly, in the HP mode the pre-driver amplification stage 110, driver amplification stage 120, and output amplification stage 140 are all turned on, and internal matching network 136 is switched in-circuit between driver amplification stage 120 and output amplification stage 140. Meanwhile, in the LP mode, the MODE SELECT signal has a second state or value (e.g., "HIGH") to cause switch 132 to select second impedance transformation network 134, and the ON/OFF signal is OFF to turn off output amplification stage 140. Accordingly, in the LP mode pre-driver amplification stage 110 is turned on, driver amplification stage 120 is tuned on, but its current is variably controlled, and output amplification stage 140 is turned off. Also, switch 132 is controlled to switch second impedance transformation network 134 in-circuit between the output of driver amplification stage 120 and first impedance transformation network 150 to thereby increase the operating efficiency of RF amplifier 100 in the LP mode.

Figure 2:
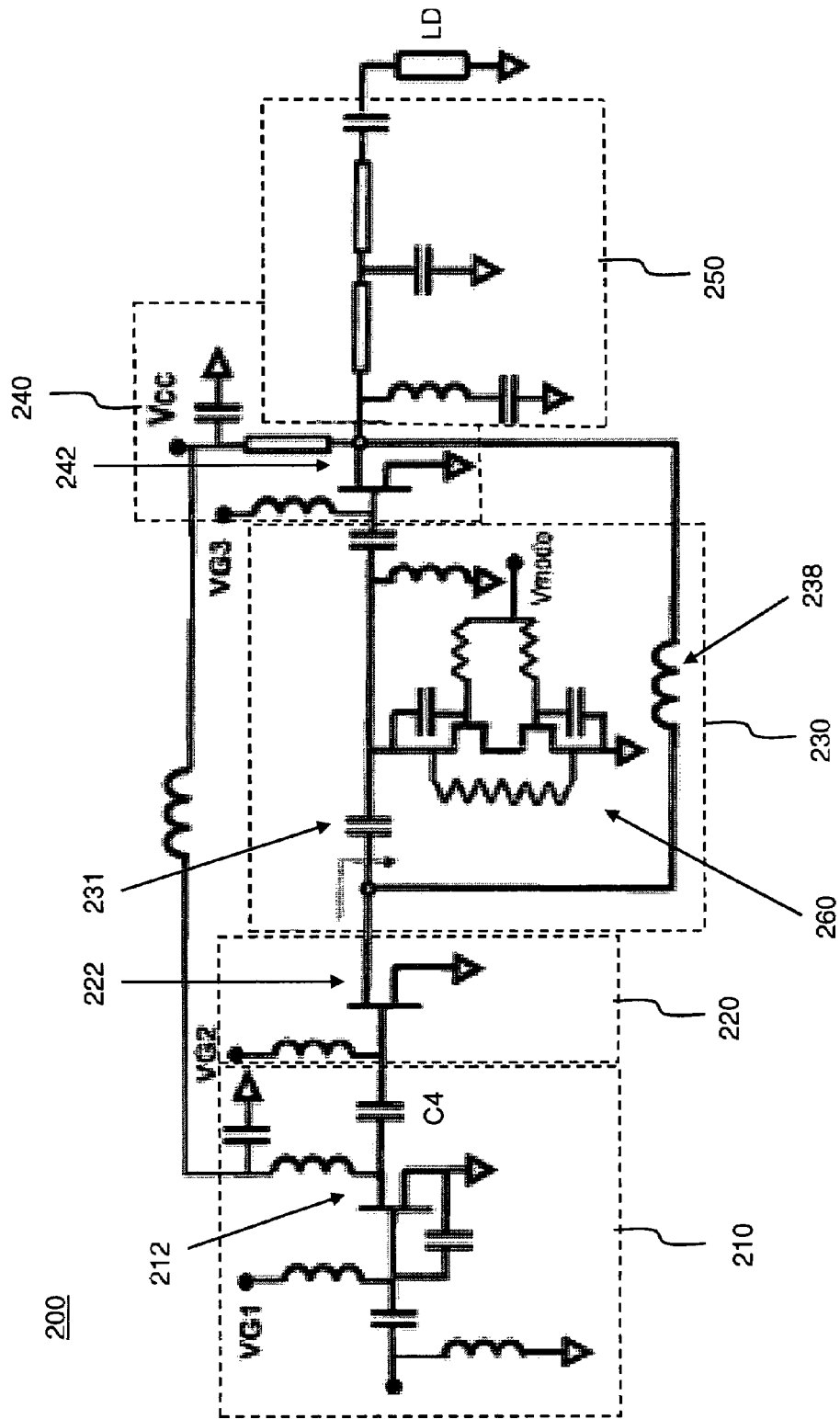
FIG. 2 shows a schematic diagram of one embodiment of an RF amplifier.

FIG. 2 shows a schematic diagram of one embodiment of an RF amplifier 200. RF amplifier 200 may be one embodiment of RF amplifier 100. RF amplifier 200 includes in pertinent part a pre-driver amplification stage 210, a driver amplification stage 220, a switching circuit 230 including switch 260, an output amplification stage 240, and a first impedance transformation network 250. The output of first impedance transformation network 250 is connected to a load LD, which is not itself part of RF amplifier 200, and may comprise one or more antennas. It should be understood that the labels and boundary, lines of various functional blocks shown in the schematic diagram of FIG. 2 are exemplary, and that many of the capacitors and inductors shown belonging to one functional block may alternatively be considered as belonging to an adjacent functional block.

As shown in FIG. 2, pre-driver amplification stage 210 includes in pertinent part a pre-driver device (e.g., a field effect transistor (FET)) 212 biased by a pre-driver device bias current received at input VG1. As also shown in FIG. 2, driver amplification stage 220 includes a driver device (e.g., FET) 222 biased by a driver device bias current received at input VG2. As further shown in FIG. 2, output amplification stage 240 includes output device (e.g., FET) 242 biased by an output device bias current received at input VG3.

In general, RF amplifier 200 is configured to operate selectively in either a high power (HP) mode or a low power (LP) mode as described above with respect to RF amplifier 100 in FIG. 1.

Switching circuit 230 operates responsive to a VMODE signal which selectively has a first state or value (e.g., LOW) to indicate operation in the HP mode, and a second state or value (e.g., HIGH) to indicate operation in the LP mode. In particular, when VMODE is LOW (e.g., 0 volts) indicating the HP mode, then switch 260 is turned OFF and an interstage matching circuit—which takes into account the OFF capacitance $C_{OFF}$ of switch 260—provides power transfer of a first amplified RF signal output from driver device 222 to output device 242 which is turned ON. Output device 242 then amplifies the first amplified RF signal. In contrast, when VMODE is HIGH (e.g., 2.2 volts) indicating the LP mode, then switch 260 is turned ON and a second impedance transformation network including capacitor 231, inductor 238, and taking into account the ON resistance $R_{ON}$ of switch 260, provides the first amplified RF signal to first impedance transformation network 250 and presents a second load impedance to driver device 222. First impedance transformation network 250 then passes the first amplified RF signal as an RF output signal to the load LD.

So, in the HP mode, pre-driver device 212, driver device (FET) 222, and output device (FET) 242 are all biased so as to be turned on. In the LP mode, pre-driver device 212 is turned on, driver device (FET) 222 is tuned on, but its current is variably controlled, and output device (FET) 242 is turned off.

Further details of the configuration and operation of the RF amplifiers 100 and 200 may be found in U.S. patent application Ser. No. 11/634,060, entitled "DUAL-MODE, DUAL-LOAD HIGH EFFICIENCY RF POWER AMPLIFIER" and filed in the names of Gee S. Dow and Chien-Lung Ho on 6 Dec. 2006, the entirety of which is hereby incorporated herein by reference for all purposes as if fully set forth herein.

Figure 3:
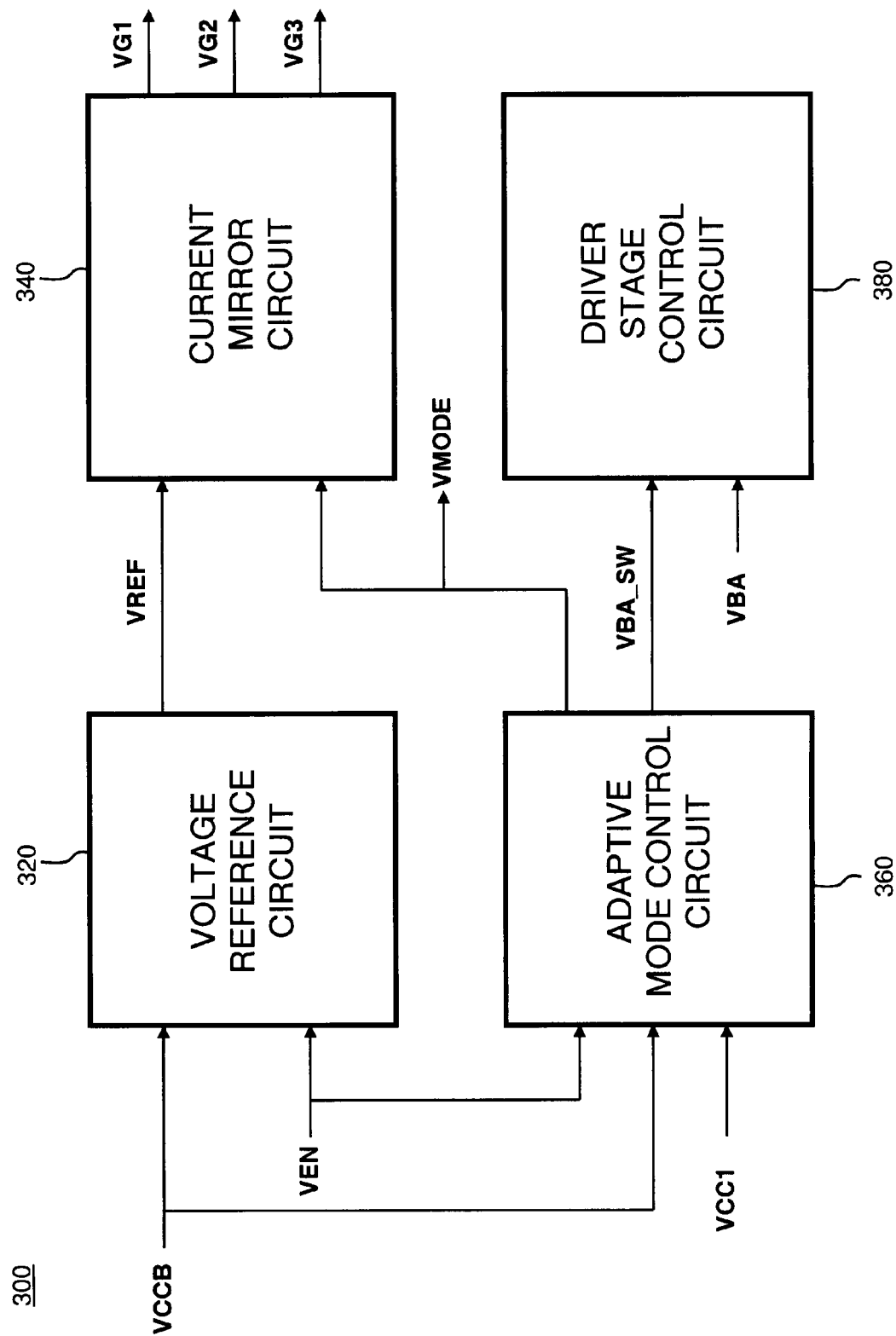
FIG. 3 shows a functional block diagram of one embodiment of a bias control circuit that can be employed with the RF amplifiers of FIGS. 1 and 2.

FIG. 3 shows a functional block diagram of one embodiment of a bias control circuit 300 that can be employed with the RF amplifiers of FIGS. 1 and 2. Bias control circuit 300 includes a voltage reference circuit 320, a current mirror circuit 340, an adaptive mode control circuit 360, and a driver stage control circuit 380.

Operationally, voltage reference circuit 320 receives a first (e.g., battery) supply voltage VCCB and an enable signal VEN and in response thereto outputs a reference voltage VREF. In general, VCCB is an unregulated battery voltage. VEN indicates whether voltage reference circuit 320 should be enabled or disabled. For example, in an application where bias control circuit 300 is employed with an RF amplifier in a mobile telephone, when the telephone enters a "sleep mode," the VEN signal may be put in a state (e.g., LOW) indicating that voltage reference circuit 320 should be disabled.

Adaptive mode control circuit 360 receives the enable signal VEN and second supply voltage VCC1 and in response thereto outputs a first mode control signal VMODE and a second mode control signal VBA_SW. VEN indicates whether adaptive mode control circuit 360 should be enabled or disabled (for example, to implement a sleep mode as discussed above). In one embodiment, to achieve the best efficiency operation of the power amplifier, second supply voltage VCC1 may be a DC-DC converted voltage generated from a battery voltage of a device (e.g., a mobile telephone) that includes bias control circuit 300, where VCC1 is adjusted in accordance with a desired output power level. In that case, in general VCC1 will have a lower voltage when the device (and therefore the RF amplifier) is to operate in the LP mode, and may have a higher voltage when the device (and therefore the RF amplifier) is to operate in the HP mode. Alternatively, VCC1 can be an unregulated battery voltage.

Adaptive mode control circuit 360 outputs first mode control signal VMODE having a first state or value (e.g., LOW) when VCC1 has a higher voltage, indicating operation in the HP mode, and having a second state or value (e.g., HIGH) when VCC1 has a lower voltage indicating operation in the LP mode. Similarly, adaptive mode control circuit 360 outputs second mode control signal VBA_SW having a first state or value (e.g., LOW) when VCC1 has a higher voltage indicating operation in the HP mode, and having a second state or value (e.g., HIGH) when VCC1 has a lower voltage indicating operation in the LP mode. In one optional embodiment, second mode control signal VBA_SW may be the same as first mode control signal VMODE.

Driver stage control circuit 380 receives the second mode control signal VBA_SW from adaptive mode control circuit 360 and in response to the second mode control signal VBA_SW indicating the low power mode (e.g., VBA_SW is HIGH) provides a driver device bias current adjust signal.

Current mirror circuit 340 receives the reference voltage VREF and produces therefrom bias currents for driving an RF amplifier. In one embodiment, current mirror circuit 340 outputs: (1) a pre-driver device bias current for use by a pre-driver device in an RF amplifier; (2) a driver device bias current for use by a driver device in an RF amplifier; and (3) an output device bias current for use by an output device in an RF amplifier. In another embodiment, where an RF amplifier omits a pre-driver stage, then current mirror circuit 340 outputs only the driver device bias current and the output device bias current. Current mirror circuit 340 also receives the first mode control signal VMODE from adaptive mode control circuit 360 and in response thereto adjusts or controls the output device bias current. Current mirror circuit 340 also receives the driver device bias current adjust signal from driver stage control circuit 380, and in response thereto adjusts or controls the driver device bias current.

Figure 4:
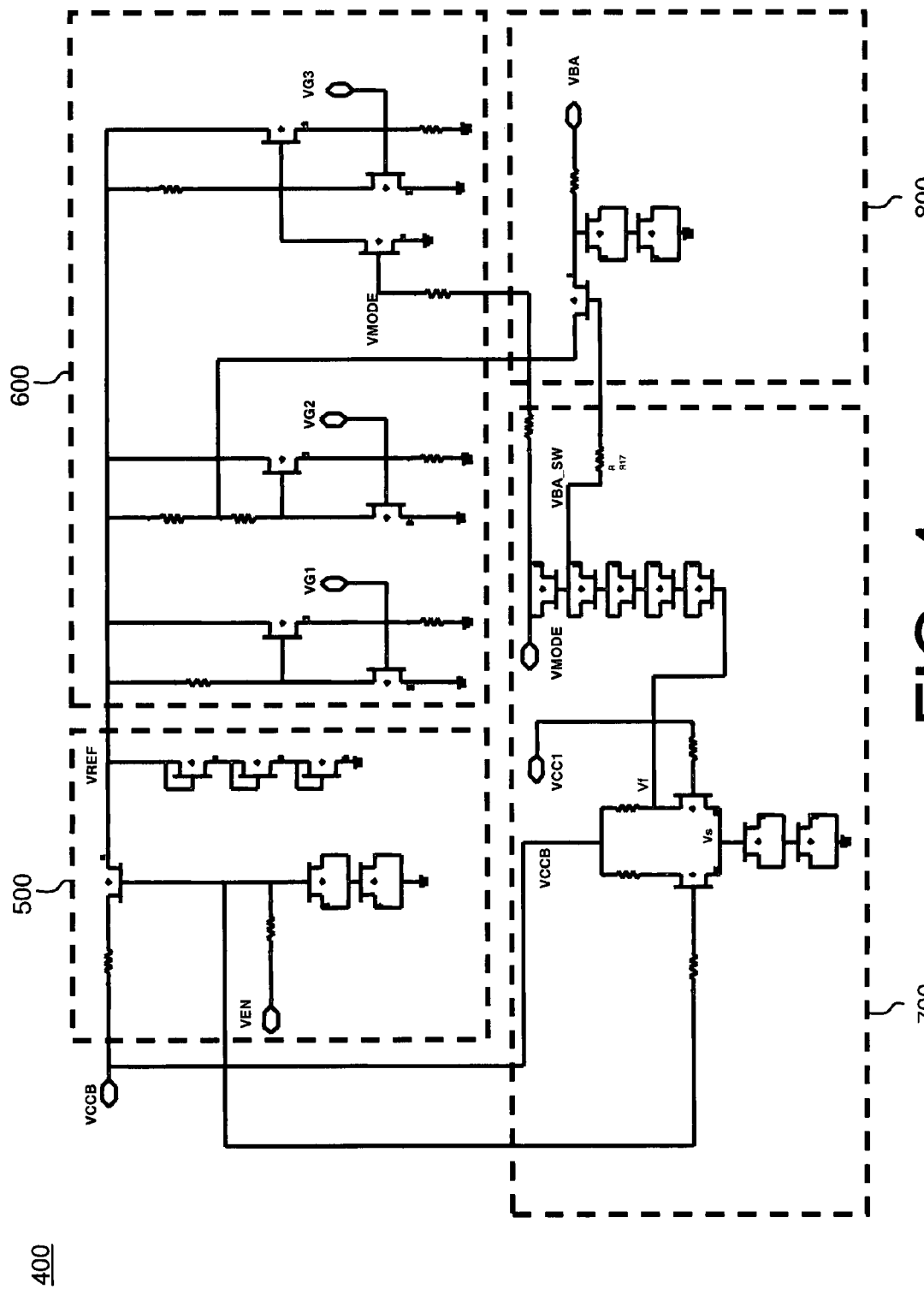
FIG. 4 shows a schematic diagram of one embodiment of a bias control circuit that can be employed with the RF amplifiers of FIGS. 1 and 2.

FIG. 4 shows a schematic diagram of one embodiment of a bias control circuit 400 that can be employed with the RF amplifiers of FIGS. 1 and 2. Bias control circuit 400 includes a voltage reference circuit 500, a current mirror circuit 600, an adaptive mode control circuit 700, and a driver stage control circuit 800. Bias control circuit 400 may correspond to bias control circuit 300 of FIG. 3, in which case, voltage reference circuit 500 corresponds to voltage reference circuit 320, current mirror circuit 600 corresponds to current mirror circuit 340, adaptive mode control circuit 700 corresponds to adaptive mode control circuit 360, and driver stage control circuit 800 corresponds to driver stage control circuit 380.

FIGS. 5-8 show detailed drawings of voltage reference circuit 500, current mirror circuit 600, adaptive mode control circuit 700, and driver stage control circuit 800, respectively. Detailed descriptions of each of these circuits will now be provided with reference to FIGS. 5-8.

Figure 5:
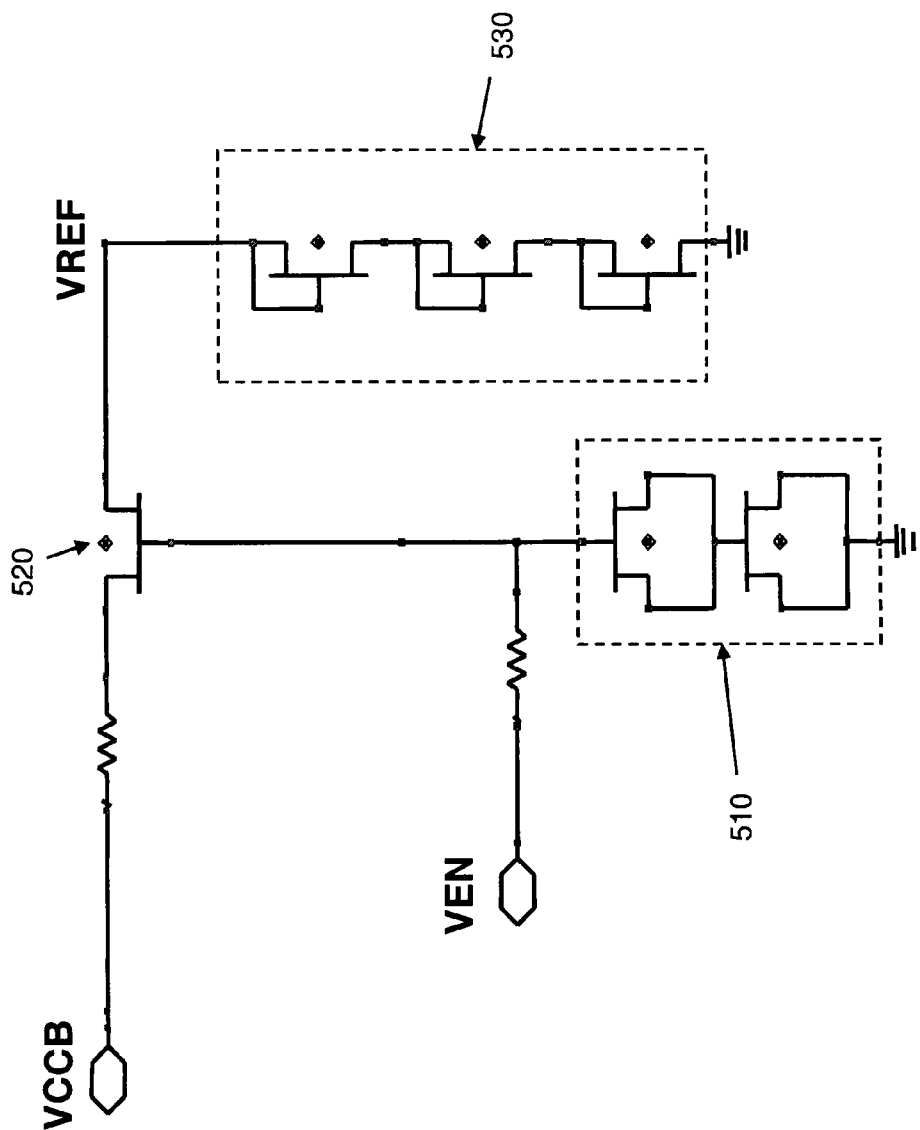
FIG. 5 shows a schematic diagram of one embodiment of a voltage reference circuit.

As shown in FIG. 5, voltage reference circuit 500 includes: a voltage clamping circuit 510; a voltage follower, comprising transistor 520, connected to voltage clamping circuit 510; and a voltage referencing circuit 530 connected to the voltage follower.

Operationally, transistor 520 is used as a pass transistor. Its drain terminal is connected to the input bias voltage, its gate terminal is connected to VEN, and its source terminal outputs the internal reference voltage VREF. Drain to source current flow in transistor 520 is controlled by the gate voltage, which is set by resistor 522 and voltage clamping circuit 510, consisting of diode-connected transistors cascaded in series. Current through transistor 520 flows to voltage referencing circuit 530, which has a low impedance and which includes a number (N) of diodes, or diode-connected transistors cascaded in series. With this structure:

$$VREF = N \times V_{ON},\qquad(1)$$

where $V_{ON}$ is the turn-on voltage of each diode in voltage referencing circuit 530.

Figure 7:
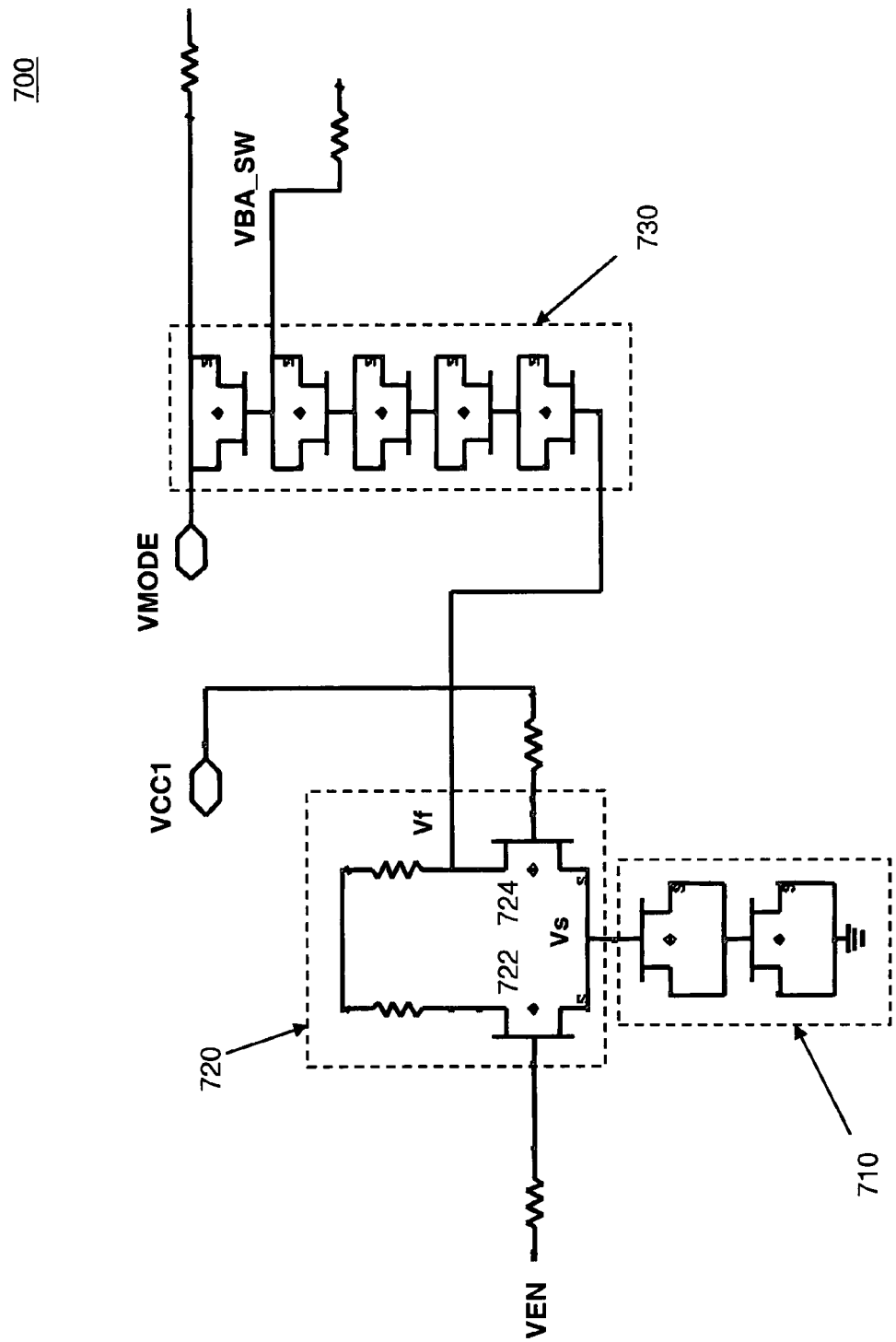
FIG. 7 shows a schematic diagram of one embodiment of an adaptive mode control circuit.

As shown in FIG. 7, adaptive mode control circuit 700 includes: a voltage clamping circuit 710; a voltage sensing circuit 720 connected to the voltage clamping circuit 710 and a level shifter 730 connected to voltage sensing circuit 720.

Operationally, adaptive mode control circuit 700 generates and outputs a first mode control signal VMODE and a second mode control signal VBA_SW based on the detection of the level of supply voltage VCC1. When VCC1 is greater than a first threshold voltage, VCH, then VMODE having a first (LOW) state or value is generated for causing an RF amplifier to enter into an HP mode of operation. Similarly, VBA_SW is generated to have a LOW state or value for the HP mode of operation Conversely, when VCC1 is less than a second threshold voltage, VCL, then VMODE having a second (HIGH) state or value is generated for causing an RF amplifier to enter into an a LP mode of operation. Similarly, VBA_SW is generated to have a HIGH state or value for the LP mode of operation. It is also noted that there is a narrow transition region of VCC1 between the HP mode and the LP mode. In this region, the switching logic can not be well determined. This region of VCC1 is to be avoided when programming the operation of DC-to-DC converter for generating VCC1.

Voltage sensing circuit 720 is constructed as a differential pair of transistors 722, 724. Voltage clamping circuit 710, consisting of a cascade of series connected transistor diodes, is connected to the common mode of the differential pair of voltage sensing circuit 720. The gate of transistor 722 is connected to VEN and is turned on when its gate voltage is higher than Vs by the threshold voltage, Vth. Meanwhile, the gate terminal of transistor 724 is connected to VCC1. When VCC1 is greater than the first threshold VCH (Vs+Vth), then transistor 724 is turned on, and as a result the voltage Vf is LOW. Conversely, when VCC1 is less than the second threshold VCL (Vs), then transistor 724 is turned off, and as a result the voltage Vf is HIGH. The voltage Vf voltage is fed to level shifter 730. Level shifter 730 consists of a cascade of a number of series connected transistor diodes. The desired output levels of first mode control signal VMODE and second mode control signal VBA_SW determine the number of diodes required.

Figure 6:
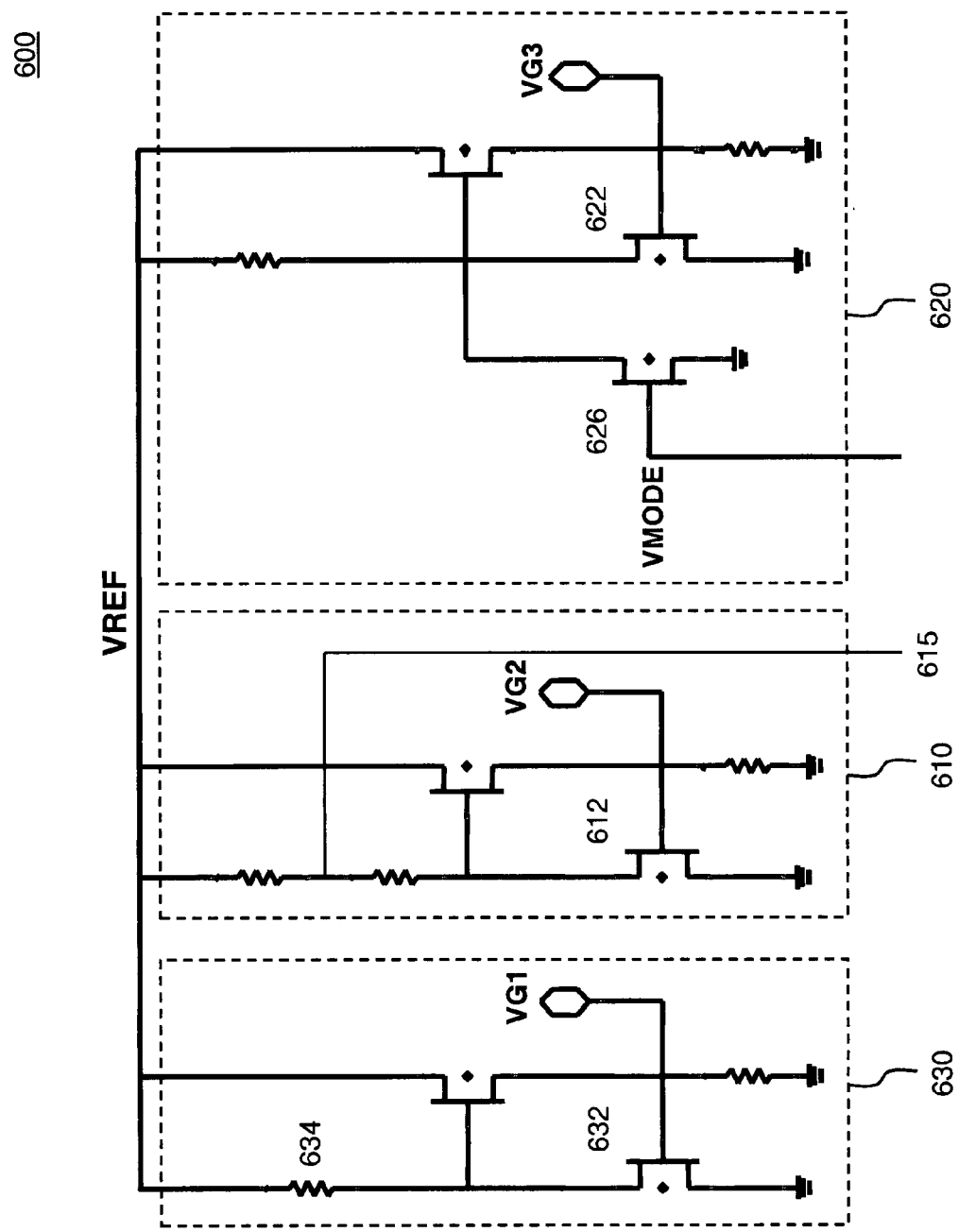
FIG. 6 shows a schematic diagram of one embodiment of a current mirror circuit.

As shown in FIG. 6, current mirror circuit 600 includes: a first current mirror 610 adapted to provide the driver device bias current for the driver device of an RF amplifier; a second current mirror 620 adapted to provide the output device bias current for the output device of an RF amplifier; and a third current mirror 630 adapted to provide the pre-driver device bias current for the pre-driver device in an RF amplifier. In an embodiment where an RF amplifier omits the pre-driver stage, then current mirror circuit 600 can omit third current mirror 630.

The purpose of current mirror is to "mirror" the operation of one transistor (reference) to the other transistor (mirror) when both transistors are sharing the same input (Gate) bias voltage. For example, where current mirror 600 is used to provide bias currents for RF amplifier 200 of FIG. 2, a current mirroring relationship exists between reference transistor 632 and pre-driver device (FET) 212, between reference transistor 612 and driver device (FET) 222, and between reference transistor 622 and output device (FET) 242. VG1, VG2 and VG3 are the output voltages of the current mirrors 630, 610, and 620, respectively.

Under this condition:

$$I\_mirror = A \times I\_ref, \qquad (2)$$

where A is the ratio of the device area of the mirror transistor to the device area of the reference transistor.

For current mirror 630, Iref is determined by the value of reference resistor 634. So current mirror 630 sets a pre-driver device bias current for a pre-driver device of an RF amplifier.

For current mirror 620, transistor 626 receives the first mode control signal VMODE from adaptive mode control circuit 700. When VMODE is LOW, then transistor 626 is turned OFF, and reference transistor 622 is turned ON. In that case, Iref is set by reference resistor 624, and an output device bias current is provided through VG3 sufficient to turn ON an output device of an RF amplifier (e.g., output device (FET) 242 of RF amplifier 200) such that the RF amplifier operates in a high power (HP) mode. On the other hand, when VMODE is HIGH, then transistor 626 is turned ON, and reference transistor 622 is turned OFF. In that case, the output device bias current provided through VG3 causes an output device of an RF amplifier (e.g., output device (FET) 242 of RF amplifier 200) to be turned OFF such that the RF amplifier operates in a low power (LP) mode.

For current mirror 610, the current through reference transistor 612 is adjusted by a driver device bias current adjust signal 615 provided by driver stage control circuit 800. In particular, as will be explained in greater detail below, driver device bias current adjust signal 615 actually provides a current sink path for draining current away from reference transistor 612. As a result, the driver device bias current provided to a driver device of an RF amplifier (e.g., driver device (FET) 222 of FIG. 2) is adjusted by the driver device bias current adjust signal. Further details of the driver device bias current adjust signal will now be provided with respect to FIG. 8.

Figure 8:
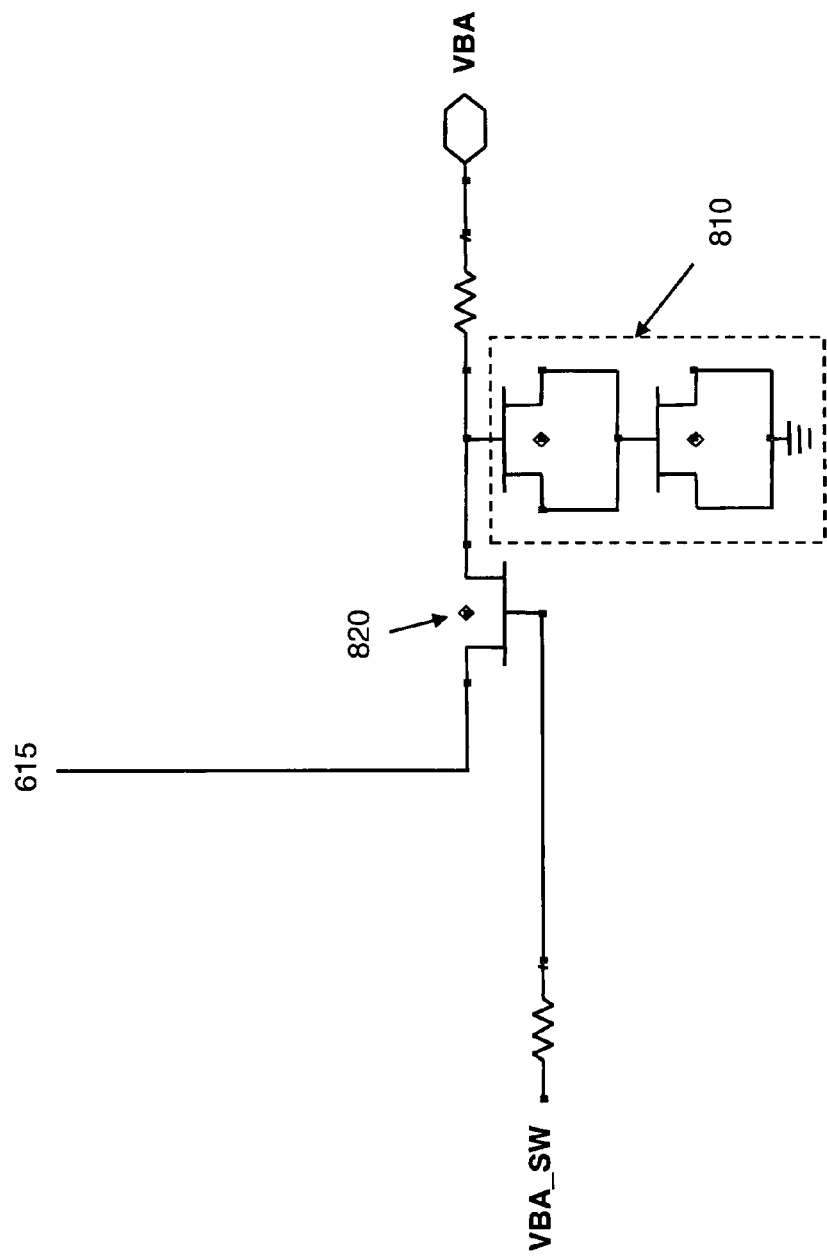
FIG. 8 shows a schematic diagram of one embodiment of a driver stage control circuit.

As shown in FIG. 8, driver stage control circuit 800 includes a voltage clamping circuit 810 and a switch 820. Switch 820 has: a first terminal connected to a bias adjust voltage VBA and further connected to voltage clamping circuit 810; a second terminal providing driver device bias current adjust signal 615 to current mirror 620 in the current mirror circuit 600; and a control terminal connected to the second mode control signal VBA_SW from adaptive mode control circuit 700. The control terminal of switch 820 is adapted to connect the first and second terminals of switch 820 when the second mode control signal VBA_SW indicates the low power (LP) mode. This in turn provides a current sink path from current mirror 610 to bias adjust voltage VBA. The purpose of bias adjust voltage VBA is to allow bias current adjustment of a driver device with an RF amplifier operates in the LP mode. In LP mode operation, second mode control signal VBA_SW is HIGH, turning ON switch 820. This creates a current sink path for current mirror 610. Then, as bias adjust voltage VBA is reduced, this causes the current passing through reference transistor 612 to also be reduced. By the current mirror relationship, this in turn reduces the current through a driver device of an RF amplifier (e.g., driver device (FET) 222 of FIG. 2). Meanwhile, in the high power (HP) mode of operation, second mode control signal VBA_SW is LOW, which turns OFF switch 820. In this case, there is no current sink to drain current from reference transistor 612, and therefore the driver device of the RF amplifier is biased at its normal HP level. Voltage clamping circuit 810 limits the range of bias adjust voltage VBA.

Efficiency and power gain vary with output power and supply voltage in RF amplifier 200 when driven by one embodiment of bias control circuit 300, when operating in a high power mode. Efficiency at low output power levels can be greatly increased by operating in a low power mode for low output power levels, as compared to operating only in the high power mode.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A bias control circuit for a radio frequency (RF) amplifier having an output device for providing an output signal to a load and a driver device for providing a drive signal to the output device, the bias control circuit comprising:
    a voltage reference circuit adapted to receive a supply voltage and to produce therefrom a reference voltage;
    a current mirror circuit adapted to receive the reference voltage and to provide a driver device bias current for the driver device and an output device bias current for the output device;
    an adaptive mode control circuit adapted to receive a supply voltage and in response to a voltage level of the supply voltage, to provide to the current mirror circuit a first mode control signal indicating one of a high power mode and a low power mode, the first mode control signal adjusting the output device bias current provided by the current mirror circuit to the output device for selectively turning on the output device in the high power mode and turning off the output device in the low power mode; and
    a driver stage control circuit adapted to receive a second mode control signal indicating one of the high power mode and the low power mode, and in response to the second mode control signal indicating the low power mode, to receive a bias adjust voltage and in response thereto to provide a driver device bias current adjust signal to the current mirror circuit for adjusting the driver device bias current.

2. The bias control circuit of claim 1, wherein the RF amplifier further comprises a pre-driver device adapted to provide an RF input signal to the driver device, and wherein the current mirror circuit provides a pre-driver device bias current for the pre-driver device.

3. The bias control circuit of claim 2, wherein the current mirror circuit comprises:
   a first current mirror adapted to provide the driver device bias current for the driver device;
   a second current mirror adapted to provide the output device bias current for the output device; and
   a third current mirror adapted to provide the pre-driver device bias current for the pre-driver device.

4. The bias control circuit of claim 1, wherein the current mirror circuit comprises:
   a first current mirror adapted to provide the driver device bias current for the driver device; and
   a second current mirror adapted to provide the output device bias current for the output device.

5. The bias control circuit of claim 1, wherein the voltage reference circuit comprises:
   a voltage clamping circuit;
   a voltage follower connected to the voltage clamping circuit; and
   a voltage referencing circuit connected to the voltage follower.

6. The bias control circuit of claim 1, wherein the voltage reference circuit includes an input for receiving a voltage enable circuit for selectively enabling and disabling the voltage reference circuit.

7. The bias control circuit of claim 1, wherein the adaptive mode control circuit comprises:
   a voltage clamping circuit;
   a voltage sensing circuit connected to the voltage clamping circuit and further adapted to receive the supply voltage; and
   a level shifter connected to the voltage comparator and adapted to output the first mode control signal.

8. The bias control circuit of claim 1, wherein the driver stage control circuit comprises:
   a voltage clamping circuit;
   a switch having:
      a first terminal connected to the bias adjust voltage and further connected to the voltage clamp circuit,
      a second terminal connected to a current mirror in the current mirror circuit that is adapted to provide the driver device bias current for the driver device, and
      a control terminal connected to the second mode control signal,
   wherein the control terminal is adapted to connect the first and second terminals when the second mode control signal indicates the low power mode.

9. A bias control circuit for a radio frequency (RF) amplifier having an output device for providing an output signal to a load and a driver device for providing a drive signal to the output device, the bias control circuit including a current mirror circuit for providing a driver device bias current for the driver device and an output device bias current for the output device, wherein when the amplifier operates in a high power mode the current mirror circuit supplies the driver device bias current at a level for turning on the driver device at a high current level and an output device bias current for turning on the output device, and wherein when the amplifier operates in a low power mode the current mirror circuit supplies a driver device bias current for turning on the driver device at a variable current level and an output device bias current for turning off the output device.

10. The bias control circuit of claim 9, wherein the RF amplifier further comprises a pre-driver device adapted to provide an RF input signal to the driver device, and wherein the current mirror circuit further provides a pre-driver device bias current for the pre-driver device.

11. The bias control circuit of claim 9, wherein the current mirror circuit comprises:
   a first current mirror adapted to provide the driver device bias current for the driver device; and
   a second current mirror adapted to provide the output device bias current for the output device.

12. The bias control circuit of claim 9, further comprising a voltage reference circuit adapted to receive a supply voltage, to produce therefrom a reference voltage, and to provide the reference voltage to the current mirror circuit.

13. The bias control circuit of claim 9, further comprising an adaptive mode control circuit adapted to receive a supply voltage and in response to a voltage level of the supply voltage, to provide to the current mirror circuit a first mode control signal indicating one of the high power mode and the low power mode, the first mode control signal adjusting the output device bias current provided by the current mirror circuit for the output device for selectively turning on the output device in the high power mode and turning off the output device in the low power mode.

14. The bias control circuit of claim 9, further comprising a driver stage control circuit adapted to receive a second mode control signal indicating one of the high power mode and the low power mode, and in response to the second mode signal indicating the low power mode, to receive a bias adjust voltage and in response thereto to provide a driver device bias current adjust signal to the current mirror circuit for adjusting the driver device bias current.

15. A method of providing bias currents to a radio frequency (RF) amplifier having an output device for providing an output signal to a load and a driver device for providing a drive signal to the output device, the method including:
   when the amplifier operates in a high power mode,
      supplying a driver device bias current at a level adapted to turn on the driver device at a high current level, and
      supplying an output device bias current for turning on the output device; and
   when the amplifier operates in a low power mode,
      supplying a driver device bias current for turning on the driver device at a variable current level, and
      supplying an output device bias current for turning off the output device.

16. The method of claim 15, wherein the RF amplifier further comprises a pre-driver device adapted to provide an RF input signal to the drive device, the method further comprising supplying a pre-driver device bias current for the pre-driver device.

17. The method of claim 15, further comprising selectively enabling and disabling the voltage reference circuit in response to an enable signal.

18. The method of claim 15, wherein supplying a driver device bias current for turning on the driver device at a variable current level further comprises adjusting the driver device bias current in response to an external control voltage.

19. The method of claim 15, further comprising:
receiving an input supply voltage; and
when the supply voltage is greater than a first threshold voltage, supplying the output device bias current for turning on the output device in the high power mode, and when the supply voltage is less than a second threshold voltage, supplying an output device bias current for turning off the output device in the low power mode.

20. The method of claim 15, wherein the driver device bias current and the output device bias current are each provided by a current mirror circuit.

* * * * *